(12) United States Patent
Yoshida et al.

(10) Patent No.: US 7,145,427 B2
(45) Date of Patent: Dec. 5, 2006

(54) COIL COMPONENT AND METHOD OF MANUFACTURING THE SAME

(75) Inventors: Makoto Yoshida, Tokyo (JP); Nobuyuki Okuzawa, Tokyo (JP); Tomokazu Ito, Tokyo (JP); Takashi Kudo, Tokyo (JP); Makoto Otomo, Tokyo (JP); Akira Sato, Tokyo (JP)

(73) Assignee: TDK Corporation, Tokyo (JP)

( * ) Notice: Subject to any disclaimer, the term of this patent is extended or adjusted under 35 U.S.C. 154(b) by 74 days.

(21) Appl. No.: 10/894,045

(22) Filed: Jul. 20, 2004

(65) Prior Publication Data

US 2005/0068148 A1 Mar. 31, 2005

(30) Foreign Application Priority Data

Jul. 28, 2003 (JP) ............................. 2003-202154
Aug. 29, 2003 (JP) ............................. 2003-307372

(51) Int. Cl.
  *H01F 5/00* (2006.01)
(52) U.S. Cl. .................... 336/200; 336/83; 336/233
(58) Field of Classification Search ................ 336/83, 336/200, 233
  See application file for complete search history.

(56) References Cited

U.S. PATENT DOCUMENTS

| 6,181,232 B1* | 1/2001 | Kitamura | 336/200 |
|---|---|---|---|
| 6,490,128 B1 | 12/2002 | Sato | |
| 6,593,841 B1* | 7/2003 | Mizoguchi et al. | 336/200 |
| 6,710,694 B1* | 3/2004 | Matsuta et al. | 336/200 |
| 2004/0075523 A1* | 4/2004 | Shimazawa et al. | 336/200 |

FOREIGN PATENT DOCUMENTS

| JP | A 7-22242 | 1/1995 |
|---|---|---|
| JP | A 8-203737 | 8/1996 |
| JP | 10-135040 A | 5/1998 |
| JP | A 11-54326 | 2/1999 |
| JP | 11-284471 A | 10/1999 |
| JP | A 2000-182834 | 6/2000 |
| JP | 2000-322709 A | 11/2000 |
| JP | 2001-217126 A | 8/2001 |
| JP | A 2002-203724 | 7/2002 |
| JP | A 2003-133135 | 5/2003 |

\* cited by examiner

*Primary Examiner*—Elvin Enad
(74) *Attorney, Agent, or Firm*—Oliff & Berridge, PLC

(57) ABSTRACT

There is provided a common mode choke coil whose impedance value can be easily adjusted by changing the thickness of an insulation layer for impedance value adjustment appropriately. An insulation layer for impedance value adjustment is formed throughout a principal surface of a first magnetic substrate. Coil patterns and insulation layers are alternately formed on that layer. Parts of the insulation layers other than the insulation layer for impedance value adjustment are removed in either or both of a central region surrounded by the coil patterns and a region around the coil patterns. A resin including magnetic powder is provided on the uppermost insulation layer and the regions where the insulation layers have been removed, and a second magnetic substrate is bonded through a bonding layer.

10 Claims, 17 Drawing Sheets

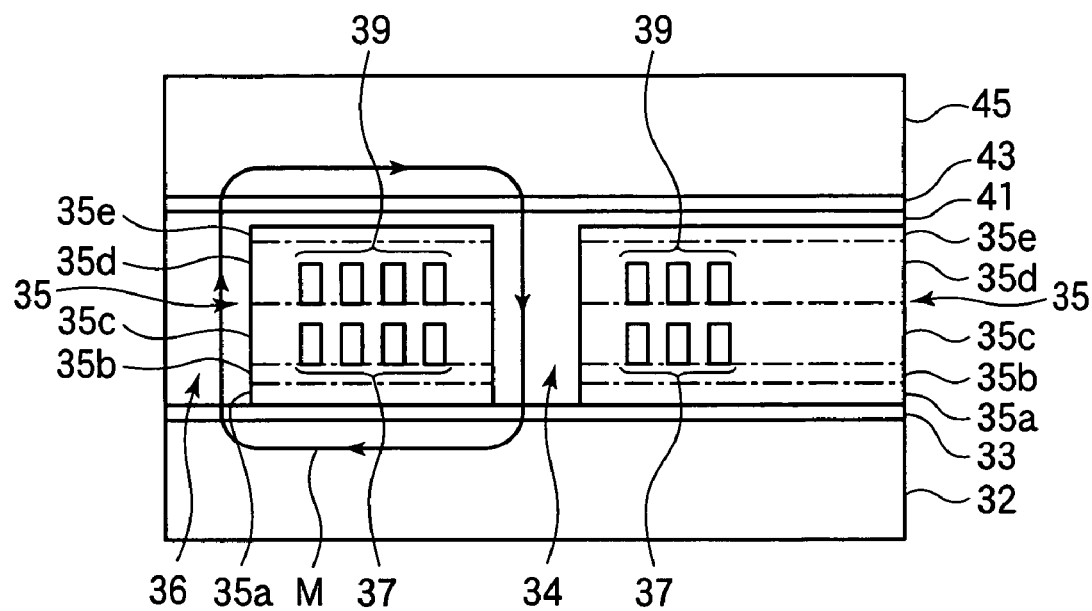

COIL COMPONENT AND METHOD OF MANUFACTURING THE SAME

BACKGROUND OF THE INVENTION

1. Field of the Invention

The present invention relates to a common mode choke coil, a method of manufacturing the same, and a common mode choke coil array. More particularly, the invention relates to a filter used for suppressing a common mode current which can cause electromagnetic interference that is a problem in a balanced transmission system and a method of manufacturing the same.

2. Description of the Related Art

Multi-layer type choke coils have been known as chip type common mode choke coils. This type of component is constructed by alternately forming magnetic sheets for a first coil which are magnetic sheets made of ferrite having a coil conductor pattern formed on a surface thereof and similar magnetic sheets for a second coil.

The common mode choke coil disclosed in Japanese Patent Laid-Open No. JP-A-8-203737 (hereinafter referred to as "Patent Document 1") is known as a component utilizing thin film techniques. This component is constructed by forming a lead-out electrode using thin film techniques on a magnetic substrate, thereafter forming an insulation layer, a first coil conductor, another insulation layer, a second coil conductor and another insulation layer sequentially, and sandwiching them with another magnetic substrate from above.

In some common mode choke coils utilizing thin film techniques, as disclosed in Japanese Patent Laid-Open No. JP-A-11-54326 (hereinafter referred to as "Patent Document 2"), in order to improve magnetic coupling between coils and to increase common impedance, a closed magnetic path structure is formed by etching central parts and peripheral parts of insulation layers as described above and bonding an upper magnetic substrate using a resin that is a mixture of an insulating material and magnetic powder.

In some common mode choke coils utilizing thin film techniques, as disclosed in Japanese Patent Laid-Open No. JP-A-2003-133135 (hereinafter referred to as "Patent Document 3"), a multi-layer element, which is a structure having a coil disposed in an insulating element provided by disposing insulation layers and coil patterns one over another on a first magnetic substrate, is formed with at least one recess extending from the top surface of the element up to the first magnetic substrate in a part of the element where no coil pattern is disposed. Further, a part of a magnetic layer disposed so as to cover the multi-layer element is embedded in the recess; and a second (upper) magnetic substrate is bonded to the magnetic layer through a non-magnetic bonding layer.

In any of the above-described common mode choke coils utilizing thin film techniques according to Patent Documents 1, 2 and 3, it is necessary to adjust the number of turns and length of the conductor and to adjust the magnetic permeability of the magnetic material in order to achieve a predetermined value of impedance (in particular, common impedance).

However, it is sometimes difficult to adjust the number of turns of the conductor because of limitations associated with the position in which an external electrode is led out. The adjustment of the conductor length is sometimes difficult for reasons associated with the shape of the chip. Further, it is quite difficult to adjust the permeability of the magnetic material minutely.

Thus, various conditions must be changed and examined one by one to adjust the impedance value, which results in a heavy burden in terms of both time and cost.

As a solution to this, according to the invention, an insulation layer for impedance value adjustment is formed on a magnetic substrate to allow impedance to be adjusted only by adjusting the thickness of the insulation layer. Thin film forming techniques are used for the insulation layer for impedance value adjustment to achieve an impedance value accurately with small variation.

In view of the above-described points, it is an object of the invention to provide a common mode choke coil, a method of manufacturing the same, and a common mode choke oil array in which an impedance value can be easily adjusted by changing the thickness of an insulation layer for impedance value adjustment appropriately.

SUMMARY OF THE INVENTION

Other objects and novel features of the invention will be made apparent in the following description of embodiments of the invention.

In order to achieve the above-described object, (1) a coil component according to the invention is characterized in that it has an insulation layer for impedance value adjustment formed on an entire principal surface of a first magnetic substrate, a coil pattern and insulation layers which are alternately formed on the insulation layer for impedance value adjustment, an insulation-layer-removed region which is formed by removing either or both of parts of the insulation layers located in a central region surrounded by the coil pattern and a region around the coil pattern and in which the insulation layer for impedance value adjustment is exposed, a resin including magnetic powder provided on the uppermost insulation layer and the insulation-layer-removed regions, and a second magnetic substrate bonded through a bonding layer formed on the resin including magnetic powder.

(2) A coil component according to the invention is a coil component as set forth in the above item (1), characterized in that the thickness of the insulation layer for impedance value adjustment is in the range from 1 micron to 20 microns.

(3) A coil component according to the invention is a coil component as set forth in the above item (1) or (2), characterized in that the insulation layer for impedance value adjustment is made of polyimide.

(4) A coil component according to the invention is a coil component as set forth in any of the above items (1) to (3), characterized in that a plurality of the coil patterns are formed.

(5) A method of manufacturing a coil component according to the invention is characterized in that it has a first film formation step for forming an insulation layer for impedance value adjustment on an entire principal surface of a first magnetic substrate, a second film formation step for alternately forming a coil pattern and insulation layers on the insulation layer for impedance value adjustment, an etching step for removing either of both of parts of the insulation layers other than the insulation layer for impedance value adjustment located in a central region surrounded by the coil pattern and a region around the coil pattern, an application step for applying a resin including magnetic powder on the uppermost insulation layer and for embedding and applying the resin including magnetic powder also in the region where the insulation layers have been removed, a polishing step for polishing and leveling a surface of the resin including magnetic powder after the resin including magnetic powder is set and a bonding step for bonding a second magnetic substrate to the leveled surface of the resin including magnetic powder through a bonding agent.

BRIEF DESCRIPTION OF THE DRAWINGS

FIG. 4 shows a schematic configuration of a section of a common mode choke coil according to a third embodiment of the invention taken orthogonally to a film forming surface of a first magnetic substrate 32;

DETAILED DESCRIPTION OF THE PREFERRED EMBODIMENTS

First Embodiment

A first embodiment of a coil component and a method of manufacturing the same according to the invention will now be described with reference to the drawings.

Figure 1:
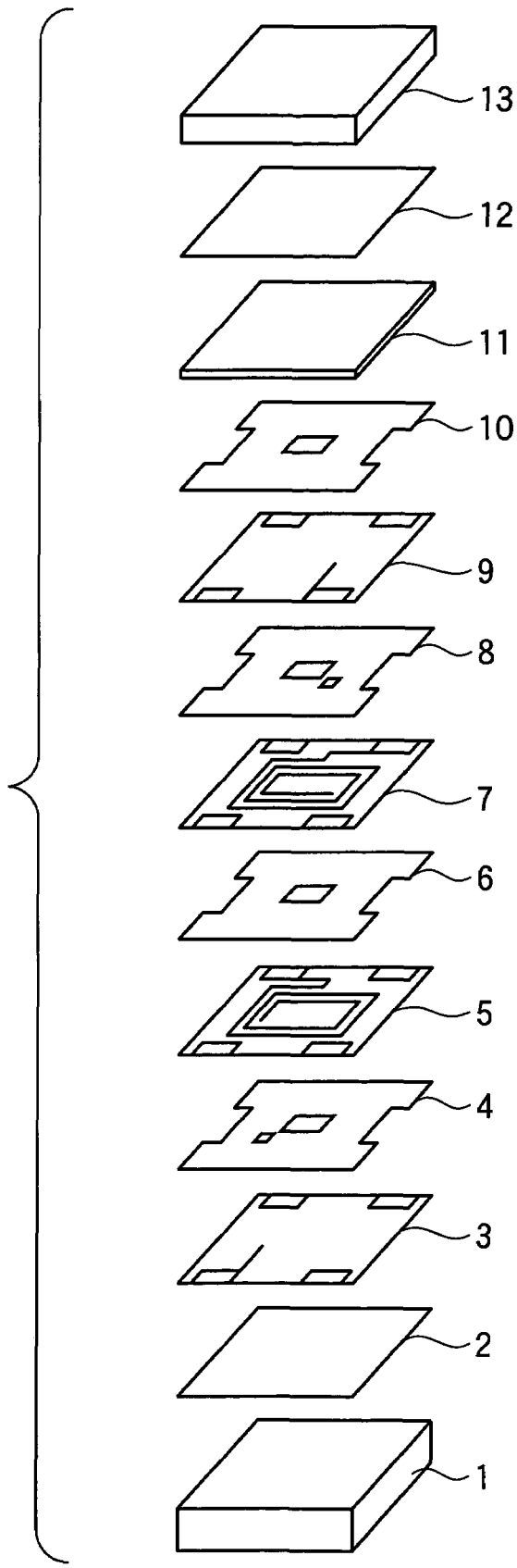
FIG. 1 is an exploded perspective view of a common mode choke coil configured according to a first embodiment of the invention.
Figure 2A:
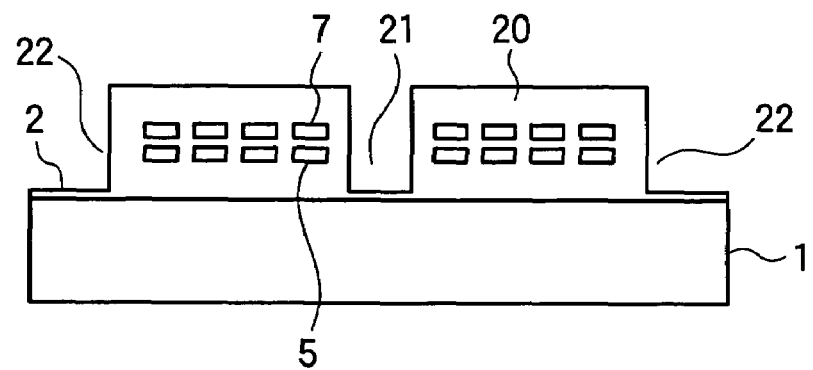
FIGS. 2A to 2C are illustrations showing manufacturing steps according to the first embodiment of the invention.
Figure 2B:
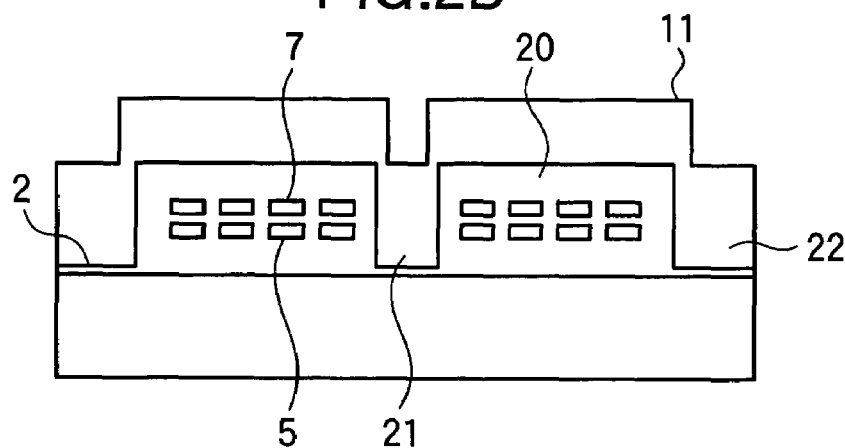
Figure 2C:
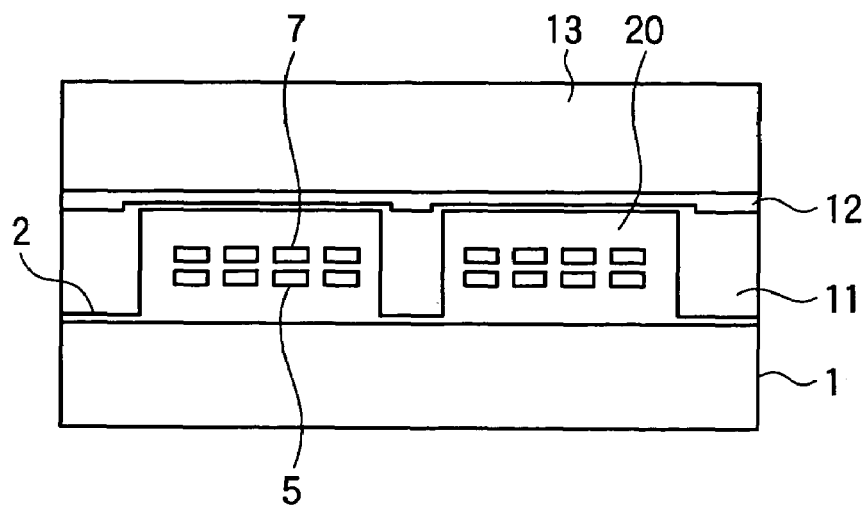

FIG. 1 and FIGS. 2A to 2C show the first embodiment of the invention. FIG. 1 is an exploded perspective view of a chip type common mode choke coil configured according to the embodiment, and FIGS. 2A to 2C show steps for manufacturing the same. While a plurality of the components is simultaneously fabricated on a substrate in practice, the present embodiment will be described with reference to one element.

As shown in those figures, the chip type common mode choke coil comprises an insulation layer 2 for impedance value adjustment, a first lead-out electrode layer 3, an insulation layer 4, a first coil conductor layer (spiral coil conductor pattern) 5, another insulation layer 6, a second coil conductor layer (spiral coil conductor pattern) 7, another insulation layer 8, a second lead-out electrode layer 9, another insulation layer 10, a magnetic layer 11, a bonding layer 12 and a second magnetic substrate 13 which are stacked and integrated in the order listed on a principal surface of a first magnetic substrate 1.

The insulation layer 2 for impedance value adjustment is formed on the entire principal surface of the first magnetic substrate 1. Electrical connection is established by through openings between the first lead-out electrode layer 3 and the first coil conductor layer 5 and between the second lead-out electrode layer 9 and the second coil conductor layer 7. Each of the lead-out electrodes and the coil conductor layers are connected to an external electrode (which is formed on an outer surface of the chip) at one end thereof.

The magnetic layer 11 is provided by applying and curing a resin including magnetic powder, and it is polished after being cured to reduce irregularities on the surface thereof. The second magnetic substrate 13 is bonded to and integrated with the leveled surface through the bonding layer 12.

The magnetic substrates 1 and 13 are made of sintered ferrite or composite ferrite. The insulation layer 2 for impedance value adjustment and the other insulation layers 4, 6, 8 and 10 are made of a material having high insulating properties and high processability such as polyimide resin and epoxy resin, and the resin including magnetic powder constituting the magnetic layer 11 is epoxy resin mixed with magnetic powder such as ferrite.

A procedure for manufacturing the chip type common mode choke coil is as follows. It should be noted that the procedure is on an assumption that the lead-out electrode layers 3 and 9 and the first and second coil conductor layers 5 and 7 that are spiral coil conductor patterns are formed using a vacuum film formation process (evaporation or sputtering) or plating.

The insulation layer 2 for impedance value adjustment made of an insulating resin is formed on the entire principal surface of the magnetic substrate 1 to a thickness in the range from 1 micron to 20 microns. Referring to the method of formation, a spin coating process, dipping process, spraying process, printing process or thin film formation process is employed. Especially, the use of a thin film formation process makes it possible to form a film with small variation and high accuracy as the insulation layer for impedance value adjustment, and it is therefore possible to obtain an accurate impedance value with small variation. When it is attempted to form the insulation layer 2 for impedance value adjustment with a thickness smaller than 1 micron, the film formation will be difficult, and the effect of adjusting an impedance value (especially a common impedance value) may be reduced. When the thickness is greater than 20 microns, there is a problem in that an impedance value will be reduced in an amount greater than required.

A metal film is formed on the insulation layer 2 for impedance value adjustment using a vacuum film formation process or plating process. Cu or Al is preferably used as the metal from the viewpoint of processability. Thereafter, a pattern is formed to fabricate the lead-out electrode 3. The patterning is performed using an etching process employing photolithography or an additive process (plating) employing photolithography.

Next, the insulation layer 4 made of an insulating resin such as polyimide is formed using the same process as that used for the insulation layer 2 for impedance value adjustment, and the layer is etched (developed) away in a region in the middle of the coil conductor patterns and a region around the same. At the same time, a contact hole for connecting the lead-out electrode layer 3 and the coil conductor layer 5 is formed.

Next, the first coil conductor layer 5 that is a spiral coil conductor pattern is formed. The same process as that used for the lead-out electrode layer 3 is used.

The insulation layer 6 made of an insulating resin is then formed. The process used is the same as that for the insulation layer 4. Thereafter, the second coil conductor layer 7, the insulation layer 8 (insulating resin), the lead-out electrode layer 9 and the insulation layer 10 (insulating resin) are sequentially formed in a similar way. The insulation layers 4, 6, 8 and 10 are preferably made of the same insulating resin material such as polyimide. The insulation layer 2 for impedance value adjustment may be made of a material different from that of the insulation layers 4, 6, 8 and 10.

Thus, a film formation step is performed to form the insulation layer 2 for impedance value adjustment and the conductor layers including the spiral coil conductor patterns alternately on the first magnetic substrate 1, and an etching process is performed to remove parts of the insulation layers in a central region surrounded by the coil conductor patterns and a region around the coil conductor patterns. As shown in FIG. 2A, a multi-layer element 20 incorporating the coil conductor patterns is provided on the first magnetic substrate 1. The insulation layer 2 for impedance value adjustment is left in a central region of the multi-layer element 20 and a region around the same with the other insulation layers removed, and a resin-removed portion 21 (recess) and resin-removed portions 22 (notches) are thus formed.

Next, a resin including magnetic powder (which will be cured into a magnetic layer) 11 is printed from above the insulation layer 10 (from above the multi-layer element 20 in FIG. 2B) at an application step that is shown in FIG. 2B (the resin is embedded and applied also in the resin-removed portions 21 and 22) and is thereafter cured.

Next, the top surface of the resin 11 including magnetic powder is polished to a certain height as shown in FIG. 2C from the irregular condition shown in FIG. 2B, and a leveling step is then performed (to reduce irregularities).

Next, at a bonding step that is shown in FIG. 2C, a bonding agent is applied to the magnetic layer 11 or the cured resin including magnetic powder whose top surface has been entirely polished and leveled to provide a bonding layer 12, thereby allowing the second magnetic substrate 13 to be applied.

While the above description has been made with reference to illustrations of one element, a plurality of elements is simultaneously fabricated on a substrate in practice. Such a product on the substrate is cut into chips in the form of individual elements, and an external electrode is formed on an outer surface of an element to complete a common mode choke coil.

The present embodiment provides the following advantages.

(1) The insulation layer 2 for impedance value adjustment formed on the magnetic substrate 1 allows fine adjustment of an impedance value (especially a common impedance value).

(2) The use of a thin film formation process allows the insulation layer 2 for impedance value adjustment to be formed with an accurate thickness, which makes it possible to fabricate a component having small variation of impedance.

Second Embodiment

Figure 3:
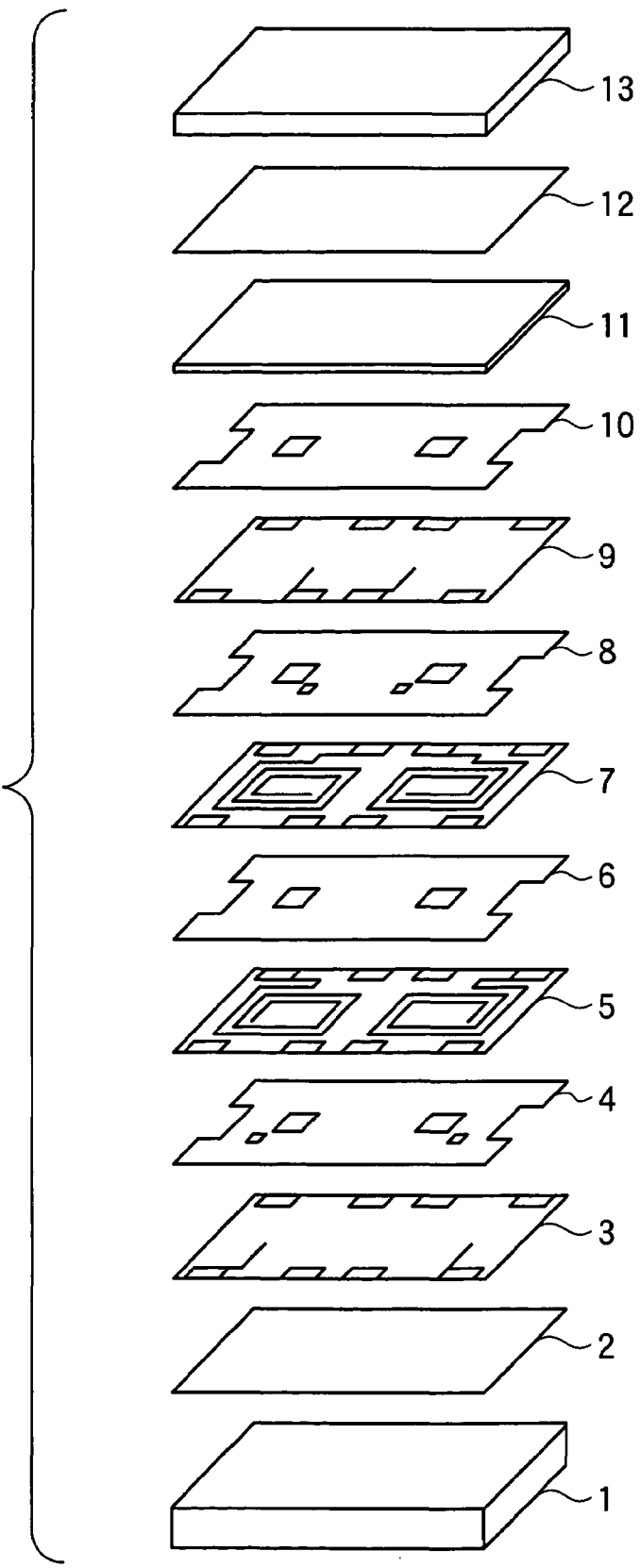
FIG. 3 is an exploded perspective view of a common mode choke coil array configured according to a second embodiment of the invention.

FIG. 3 shows a second embodiment of the invention and shows an example of fabrication of a common mode choke coil array. In this case, two common mode choke coils according to the above-described embodiment are formed side by side on a first magnetic substrate 1. Parts identical or equivalent to those in the above-described embodiment are indicated by like reference numerals and will not be described.

In the above-described embodiment, parts of the insulation layers other than the insulation layer 2 for impedance value adjustment in both of the central region surrounded by the coil patterns and the region around the coil patterns are removed to form resin-removed portions which are then filled with the resin including magnetic powder. A configuration may alternatively employed in which a resin-removed portion to be filled with the resin including magnetic powder is formed by removing either of the parts of the insulation layers other than the insulation layer 2 for impedance value adjustment in the central region surrounded by the coil patterns and the region around the coil patterns.

While the first and second embodiments of the invention have been described, it will be apparent to those skilled in the art that the invention is not limited to those embodiments and may be modified and altered in various ways within the scope of the claims.

As described above, according to the first and second embodiments of the invention, fine adjustment of an impedance value can be easily made by changing the thickness of the insulation layer for impedance value adjustment appropriately.

Third Embodiment

A third embodiment of the invention relates to a coil component uses as a major component of a common mode choke coil or transformer and a method of manufacturing the same.

Reductions in the size of electronic apparatus such as personal computers and portable phones have resulted in demand for reductions in the size and thickness (height) of electronic components such as coils and capacitors that are mounted on circuits in electronic apparatus.

However, a wound-wire coil provided by winding a copper wire around a ferrite core has a problem in that it is difficult to make compact because of structural limitations. Under the circumstances, research and development is active on chip type coil components which can be provided with a small size and a small height. Known chip type coil components include multi-layer type coil components provided by forming a coil conductor pattern on a surface of a magnetic sheet such as ferrite and stacking such magnetic sheets and thin film type coil components provided by alternately forming insulation films and coil conductors in the form of metal thin films using thin film formation techniques.

Figure 12A:
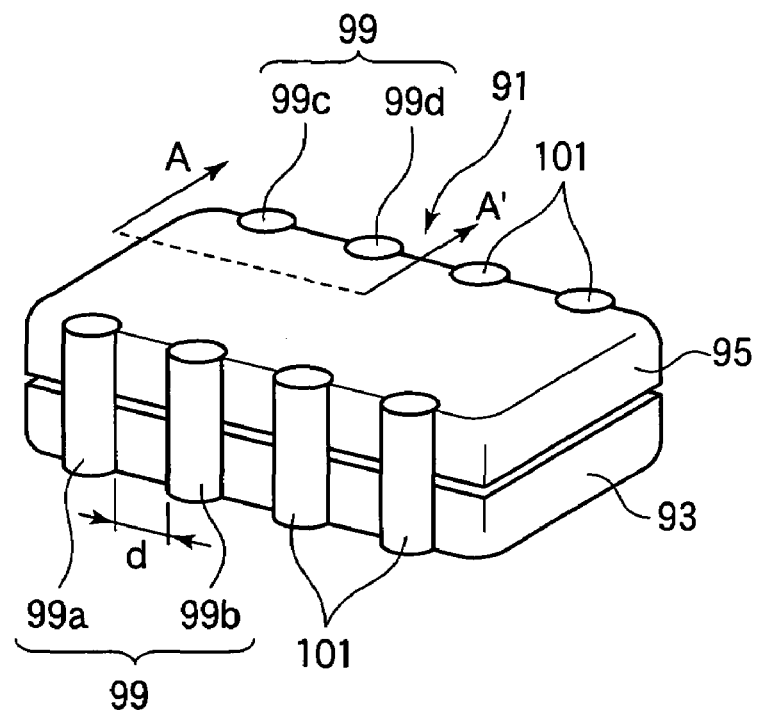
FIGS. 12A and 12B show a common mode choke coil array 91 according to the related art provided by integrating two common mode choke coils, FIG. 12A being a perspective view showing the appearance of the common mode choke coil array 91, FIG. 12B showing a section of the same taken along the imaginary line A–A' shown in a broken line in FIG. 12A.
Figure 12B:
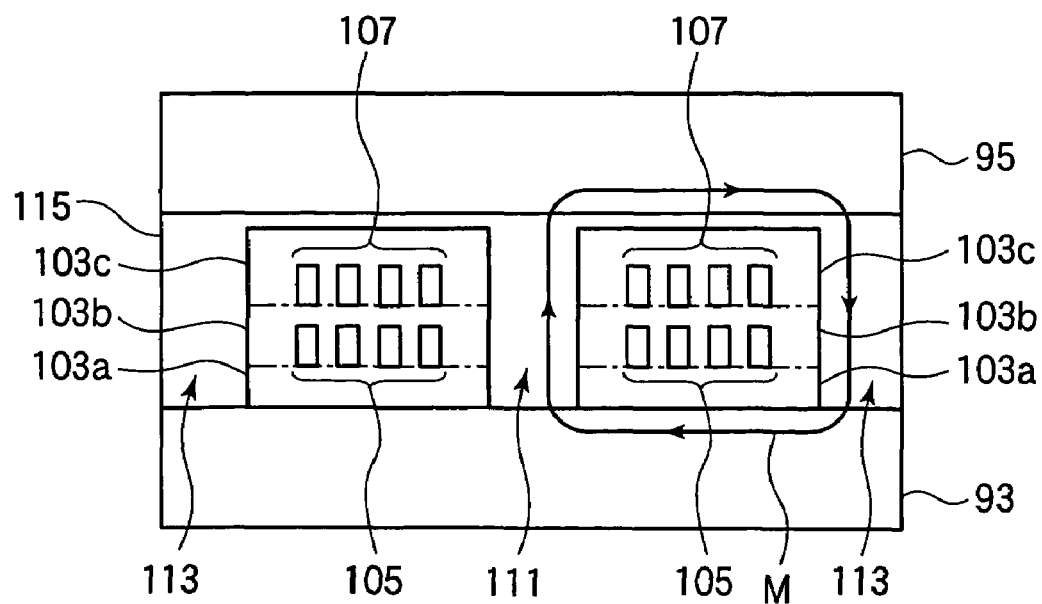

Patent Document 2 discloses a common mode choke coil as a thin film type coil component. FIGS. 12A and 12B show a common mode choke coil array 91 provided by integrating two common mode choke coils. FIG. 12A is a perspective view showing the appearance of the common mode choke coil array 91. FIG. 12B shows a section taken along the imaginary line A–A' shown in a broken line in FIG. 12A. As shown in FIGS. 12A and 12B, the common mode choke coil array 91 has a structure in which insulation films 103a, 103b and 103c made of polyimide resin and coil conductors 105 and 107 in the form of spirals are sequentially formed between ferrite substrates (magnetic substrates) 93 and 95 provided opposite to each other. Either of the choke coils of the common mode choke coil array 91 is formed with four electrode terminals 99 (99a, 99b, 99c and 99d) which extend across sides of the ferrite substrates 93 and 95 and which are connected to a terminal portion of the coil conductor 105 or 107. Similarly, the other choke coil is formed with four electrode terminals 101 which extend across the sides of the ferrite substrates 93 and 95 and which are connected to a terminal portion of the coil conductor (not shown).

Openings are formed in the insulation films 103a, 103b and 103c on the inner circumference side of the spiral coil conductors 105 and 107 to form open regions 111 where the magnetic substrate 93 is exposed. Similarly, openings are formed in the insulation films 103a, 103b and 103c on the outer circumference side of the coil conductors 105 and 107 to form open regions 113 where the magnetic substrate 93 is exposed. A magnetic layer 115 made of a magnetic material obtained by mixing magnetic powder in an insulating material is formed on the open regions 111 and 113 and the insulation film 103c to improve the degree of magnetic coupling between the coil conductor 105 and the coil conductor 107 and to improve impedance characteristics by increasing common impedance. The magnetic layer 115 has bonding capability to bond and secure the magnetic substrate 95. A common mode choke coil is known, in which the strength of the coil component is improved by applying a bonding agent between the magnetic substrate 95 and the magnetic layer 115 because the bonding strength of the magnetic layer 115 is insufficient (see Patent Document 3).

The electrode terminal 99a and the electrode terminal 99c are connected to two terminals (not shown) of the coil conductor 105, respectively, and the electrode terminal 99c and the electrode terminal 99d are connected to two terminals (not shown) of the coil conductor 107, respectively. The electrode terminal 99a and the electrode terminal 99b are provided adjacent to each other on one side of the common mode choke coil array 91. The electrode terminal 99c and the electrode terminal 99d are provided adjacent to each other on another side of the common mode choke coil array 91. When the coil conductors 105 and 107 are energized by passing a current between the electrode terminals 99a and 99c and between the electrode terminals 99b and 99d, a closed magnetic path M is formed, the magnetic path extending through the magnetic substrate 93, the magnetic layer 115 in the open region 111, the magnetic substrate 95 and the magnetic layer 115 in the open region 113 when viewed in a section including the center axes of the coil conductors 105 and 107.

Although not shown, Japanese Patent Laid-Open No. JP-A-7-22242 discloses a thin film type coil component in which an insulation layer having a high insulation resistance made of $Al_2O_3$ (alumina) is formed between a magnetic substrate and a coil conductor in consideration to the fact that a magnetic substrate having low insulating properties results in low impedance characteristics when a coil conductor is formed directly on the magnetic substrate.

In order to make the common mode choke coil array 91 compact, the intervals between the electrode terminals 99 and the electrode terminals 101 must be small. Further, an interval d between the electrode terminal 99a and the electrode terminal 99b and an interval d (not shown) between the electrode terminal 99c and the electrode terminal 99d must be small. For example, the pitches between the electrode terminals 99a and 99b and between the electrode terminals 99c and 99d must be on the order of 500 μm in order to match them with the pitch of input and output terminals of an IC (Integrated Circuit) component. In spite of the fact that the pitches between the electrode terminals 99a and 99b and between the electrode terminals 99c and 99d are small, it is required to provide an insulation resistance as high as 100 MΩ or more between the electrode terminals.

The electrode terminals 99 and 101 are multi-layer structures provided by forming Sn (tin), Ni and Cu (copper) on Ni (nickel) electrode films (not shown) formed on sides of the common mode choke coil array 91, the terminals being formed using barrel plating. During barrel plating, polarization normally occurs only on a surface having a low resistance to form a plating film thereon. However, when there are microscopic irregularities on the surface, the plating solution can enter recesses, and a plating film may be selectively formed in the recesses because of variation of a surface potential attributable to local differences in the density of the plating solution. In the case of the common mode choke coil array 91 shown in FIGS. 12A and 12B, a plating film is formed only on the electrode films (not shown) because there is a high insulation resistance on the surface of the array excluding the electrode films. However, since the electrode films are formed across the magnetic substrates 93 and 95, when there is a gap between the magnetic substrate 93 and the magnetic layer 115 or between the magnetic layer 115 and the magnetic substrate 95, a plating film can grow from the gap.

Figure 13:
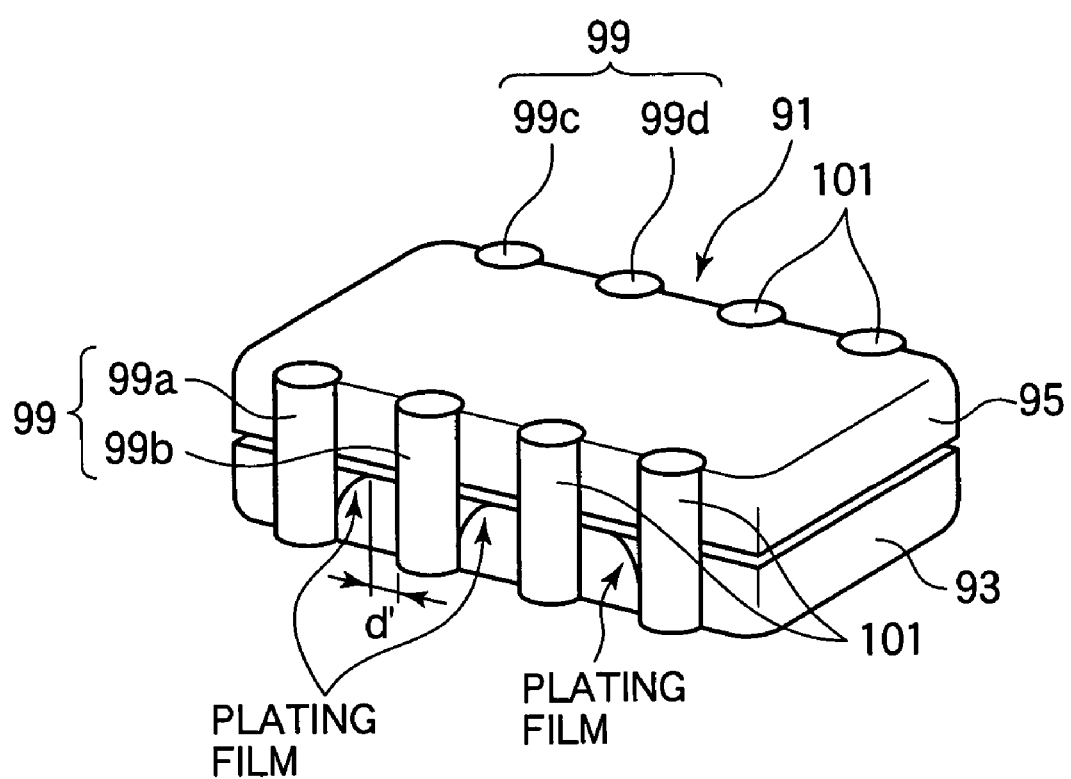
FIG. 13 is a perspective view of the common mode choke coil array 91 according to the related art in a state in which a plating film is formed between a magnetic substrate 93 and a magnetic layer 115 thereof.

FIG. 13 is a perspective view of a common mode choke coil array 91 in which a plating film has been formed between the magnetic substrate 93 and the magnetic layer 115 (not shown). When a plating film is formed between the magnetic substrate 93 and the magnetic layer 115, the intervals between the electrode terminals 99 and 101, between the electrode terminals 99a and 99b, and between the electrode terminals 99c and 99d become small as shown in FIG. 13, which results in a reduction of resistance between the terminals. In particular, when the magnetic substrate 93 has a void on the surface thereof and the magnetic layer 115 is made of composite ferrite obtained by mixing magnetic powder of ferrite in a resin material such as polyimide resin, the degree of adhesion between the magnetic substrate 93 and the magnetic layer 115 is low, and a plating film is likely to grow between the magnetic substrate 93 and the magnetic layer 115 to reduce the resistance between the terminals as described above. For example, when the interval d between the electrode terminals 99a and 99b changes into an interval d' (=d/2) as a result of formation of a plating film, the value of resistance between the electrode terminals is substantially halved. Then, the possibility of insulation breakdown between the electrode terminals 99a and 99b increases, and the reliability of common mode choke coil array 91 is therefore significantly reduced. When the formation of a plating film between the magnetic substrate 93 and the magnetic layer 115 further proceeds, shorting occurs between the electrode terminals 99a and 99b in the worst case.

Let us now assume that the coil conductor 105 is formed directly on the magnetic substrate 93 and the coil conductor 107 is formed directly on the magnetic substrate 95. Then, if insulation resistance on the surface of the magnetic substrates 93 and 95 is low and the coil conductors 105 and 107 are at small pitches, a current flows between the coil conductors 105 through the surface of the magnetic substrate 93, and a current similarly flows between the coil conductors 107 through the surface of the magnetic substrate 95, which constitutes a major cause of degradation of impedance characteristics. Furthermore, when the coil conductors 105 and 107 at small pitches are formed on the magnetic substrates 93 and 95 using a frame plating process, it is difficult to remove parts of electrode layers entrapped in voids on the magnetic substrates 93 and 95 made of ferrite because there are a large number of voids. The parts of electrode layers remaining on the magnetic substrates 93 and 95 reduce insulation resistance on the surface of the magnetic substrates 93 and 95 and degrade impedance characteristics. For this reason, in the common mode choke coil array 91, the insulation films 103a and 103c are provided between the magnetic substrates 93 and 95 and the coil conductors 105 and 107 to maintain insulating properties. However, in general, the insulation films 103a and 103c are formed by applying a resin material. It is therefore necessary to make the insulation films 103a and 103c thick enough to maintain sufficient insulating properties on the surface of the magnetic substrates 93 and 95 having voids and to improve the impedance characteristics of the common mode choke coil array 91 sufficiently, which results in an increase in the thickness of the common mode choke coil array 91 and can therefore hinder a reduction of the height of the same.

It is an object of the embodiment to provide a reliable and compact coil component having a small height in which the occurrence of shorting failures between electrode terminals is suppressed and which undergoes less degradation of impedance characteristics.

It is another object of the embodiment to provide a method of manufacturing a coil component which makes it possible to manufacture a reliable and compact coil component having a small height in which the occurrence of shorting failures between electrode terminals is suppressed and which undergoes less degradation of impedance characteristics.

The above-described objects are achieved by a coil component characterized in that it has a first magnetic substrate formed of a magnetic material, a first insulation film formed on the first magnetic substrate, a second insulation layer formed on the first insulation layer, a conductive coil conductor embedded in the second insulation layer and formed in a spiral configuration, an open region which is formed on the inner circumference side and on the outer circumference side of the coil conductor and in which the first insulation layer is exposed, a magnetic layer formed such that it is at least embedded in the open region, a second magnetic substrate secured on the magnetic layer and formed of a magnetic material, and an electrode terminal which is connected to a terminal portion of the coil conductor and which is provided across sides of the first and second magnetic substrates.

A coil component according to the present embodiment is characterized in that a third insulation layer is further formed between the magnetic layer and the second magnetic substrate.

A coil component according to the present embodiment is characterized in that the first insulation layer is formed in the vicinity of the electrode terminal.

A coil component according to the present embodiment is characterized in that the first insulation layer is formed of $Al_2O_3$.

A coil component according to the present embodiment is characterized in that a plurality of the coil conductors is formed so as to sandwich the insulation films.

The above-described objects are achieved by a method of manufacturing a coil component characterized in that it has the steps of forming a first insulation layer on a first magnetic substrate formed of a magnetic material, forming an insulation film which forms a part of a second insulation layer on the first insulation layer, forming a conductive coil conductor on the insulation film, forming an insulation film which forms another part of the second insulation layer on the coil conductor, forming an open region on the inner circumference side and on the outer circumference side of the coil conductor to expose the first insulation layer, forming a magnetic layer which is at least embedded in the open region, securing a second magnetic substrate formed of a magnetic material on the magnetic layer, and forming an electrode terminal which is connected to a terminal portion of the coil conductor and which is provided across sides of the first and second magnetic substrates.

A method of manufacturing a coil component according to the present embodiment is characterized in that a third insulation layer is further formed between the magnetic layer and the second magnetic substrate.

A method of manufacturing a coil component according to the present embodiment is characterized in that the first insulation layer is formed using a sputtering process.

A method of manufacturing a coil component according to the present embodiment is characterized in that the coil conductor is formed using a frame plating process.

The present embodiment makes it possible to manufacture a reliable and compact coil component having a small height in which the occurrence of shorting failures between electrode terminals can be suppressed and which undergoes less degradation of impedance characteristics.

A coil component and a method of manufacturing the same according to the present embodiment will now be described with reference to FIGS. 4 to 11E. As an example of a coil component according to the present embodiment, a common mode choke coil will be described in which a common mode current that can cause electromagnetic interference in a balanced transmission system is suppressed. FIG. 4 shows a section of one of common mode choke coils constituting the common mode choke coil array 63 shown in FIG. 11E taken along the imaginary line A–A' in FIG. 11E. As shown in FIG. 4, the common mode choke coil of the present embodiment is characterized in that a first insulation layer 33 is formed on a first magnetic substrate 32 made of a magnetic material. Insulation films 35a and 35b, a conductive coil conductor 37, an insulation film 35c, a coil conductor 39, and insulation films 35d and 35e are stacked in the order listed on the first insulation layer 33. The coil conductor 37 and coil conductor 39 are facing each other with the insulation film 35C between them. The coil conductors 37 and 39 are embedded in a second insulation layer 35 that is constituted by the insulation films 35a to 35e. The second insulation layer 35 on the inner circumference side of the coil conductors 37 and 39 are removed to form an open region 34 where the first insulation layer 33 is exposed. The second insulation layer 35 on the outer circumference side of the coil conductors 37 and 39 is removed to form an open region 36 where the first insulation layer 33 is exposed. A magnetic layer 41 is formed such that it is embedded in the open regions 34 and 36, and a second magnetic substrate 45 formed of a magnetic material is secured on the magnetic layer 41.

The first and second magnetic substrates 32 and 45 are formed of a magnetic material, e.g., ferrite. For example, the first insulation layer 33 is formed of an insulating material, e.g., $Al_2O_3$ (alumina) to provide a high surface resistance. Each of the insulation films 35a, 35b, 35c, 35d and 35e of the second insulation layer 35 on the first insulation layer 33 is patterned in a predetermined configuration by applying polyimide resin.

The coil conductor 37 is patterned in the form of a spiral on the insulation film 35b. The insulation film 35c is formed on the insulation film 35b so as to cover the coil conductor 37. The coil conductor 39 which is patterned in the form of a spiral substantially similar to the coil conductor 37 is formed on the insulation film 35c.

The insulation film 35d of polyimide resin is formed on the insulation film 35c so as to cover the coil conductor 39. The insulation film 35e of polyimide resin is formed on the insulation film 35d. Lead terminals and lead wires (both of which are not shown) for connecting the coil conductor 37 and an electrode terminal (not shown) are formed on the insulation film 35a. Similarly, lead terminals and lead wires (both of which are not shown) for connecting the coil conductor 39 and another electrode terminal (not shown) are formed on the insulation film 35d.

The magnetic layer 41 is embedded in the open regions 34 and 36 and formed so as to cover the second insulation layer 35. The magnetic layer 41 is formed of composite ferrite obtained by mixing magnetic powder of ferrite in polyimide resin. Further, a bonding layer 43 is formed on the magnetic layer 41 to bond the second magnetic substrate 45 of ferrite thereon.

Operations of the common mode choke coil according to the present embodiment will now be described. When the coil conductors 37 and 39 are energized, a magnetic path M is formed, the magnetic path passing through the first magnetic substrate 32, the first insulation layer 33, the magnetic layer 41 in the open region 36, the bonding layer 43, the second magnetic substrate 45, the bonding layer 43, the magnetic layer 41 in the open region 34 and the first insulation layer 33 in the order listed in a section including the center axes of the coil conductors 37 and 39. Although the first insulation layer 33 and the bonding layer 43 are non-magnetic, substantially no leakage of magnetic lines of flux occurs in those regions because they are both as thin as a few μm, and the magnetic path M may be regarded as a substantially closed magnetic path. Therefore, the common mode choke coil exhibits a preferable degree of magnetic coupling and has high impedance characteristics. Since the coil conductor 39 is provided close to and opposite to the coil conductor 37 with the insulation film 35c interposed between them, the degree of magnetic coupling and impedance characteristics of the common mode choke coil are further improved.

A method of manufacturing the common mode choke coil according to the present embodiment will now be described with reference to FIGS. 5A to 11E. By way of example, the following description will be made by referring to a common mode choke coil array 63 provided by integrating two common mode choke coils. FIGS. 5A to 5C, FIG. 6, FIGS. 9A to 9C and FIGS. 10A to 10C show a wafer 47 in the lower part and show a perspective view of an individual chip in the wafer 47 which has not been cut and separated yet in practice in the upper part. Elements having the same effects and functions as those of the elements of the common mode choke coil shown in FIG. 4 are indicated by like reference numerals and will not be described.

Figure 5A:
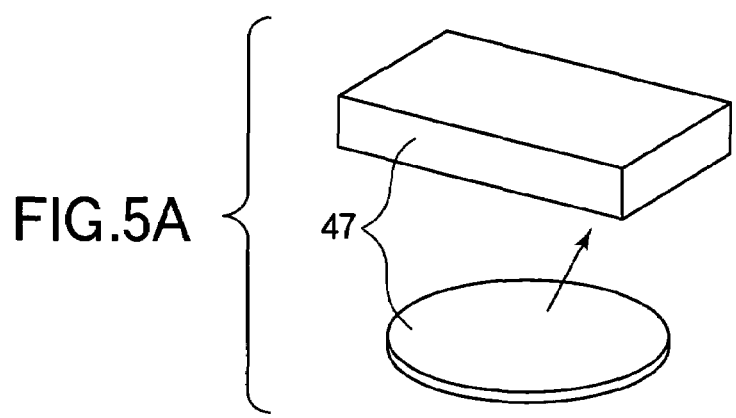
FIGS. 5A to 5E show steps for manufacturing a common mode choke coil array 63 according to the third embodiment of the invention.
Figure 5B:
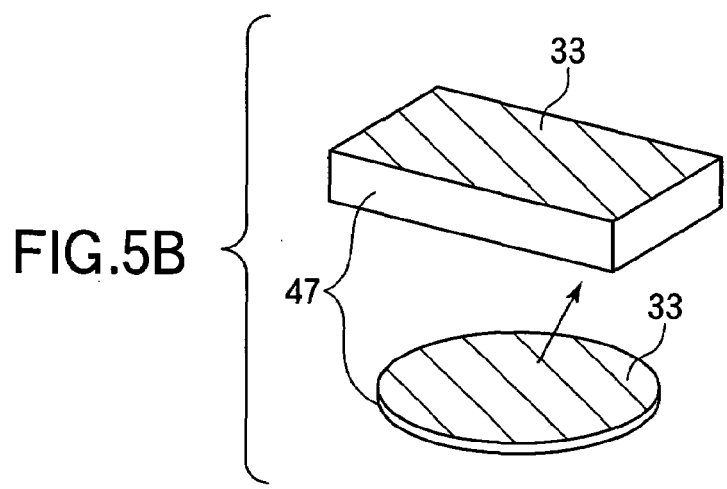

First, as shown in FIG. 5A, there is provided a wafer 47 which will eventually constitutes the first magnetic substrate 32. Next, as shown in FIG. 5B, the first insulation layer 33 of $Al_2O_3$ is formed on the wafer 47 using a sputtering process. The first insulation layer 33 is not limited to $Al_2O_3$, and any material having a high insulation resistance such as $SiO_2$ (silicon oxide film) or AlN (aluminum nitride film) may be used. The first insulation layer 33 is preferably fine enough without being affected by voids on the wafer 47. For this purpose, the above-mentioned material is preferably formed to a thickness in the range from 0.1 μm to 10 μm using a sputtering process.

Figure 5C:
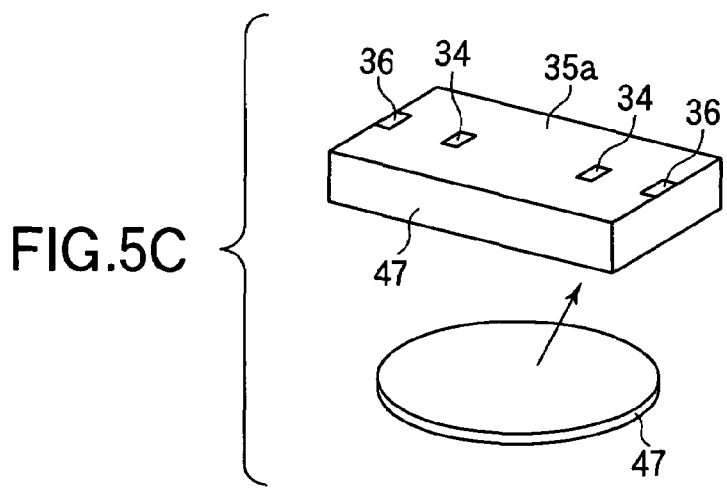
Figure 5D:
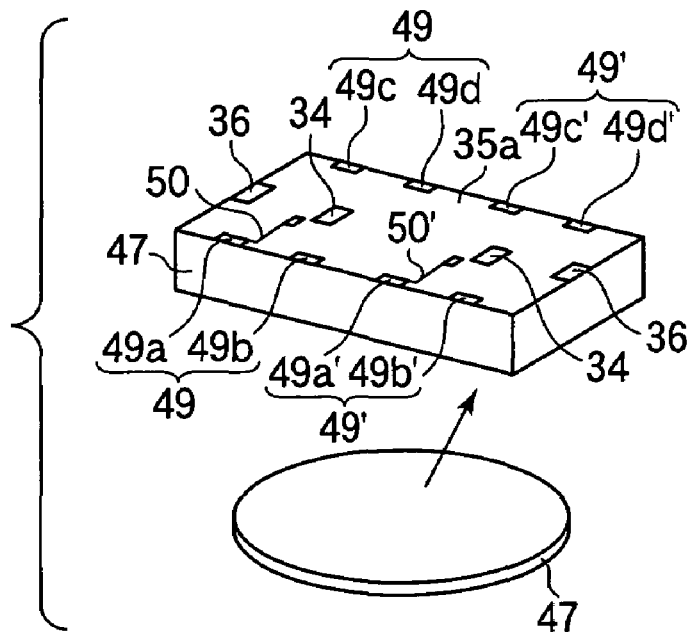

Next, as shown in FIG. 5C, polyimide resin is applied to the first insulation layer 33 and patterned to form the insulation film 35a which has openings constituting the open regions 34 and 36. Next, as shown in FIG. 5D, a Cu (copper) layer is formed on the insulation film 35a and patterned to form lead terminals 49 (49a, 49b, 49c and 49d) and lead terminals 49' (49a', 49b', 49c' and 49d') which are located at the periphery of the substrate of the element. At the same time, a lead wire 50 connected to the lead terminal 49a and a lead wire 50' connected to the lead terminal 49a' are formed.

Figure 5E:
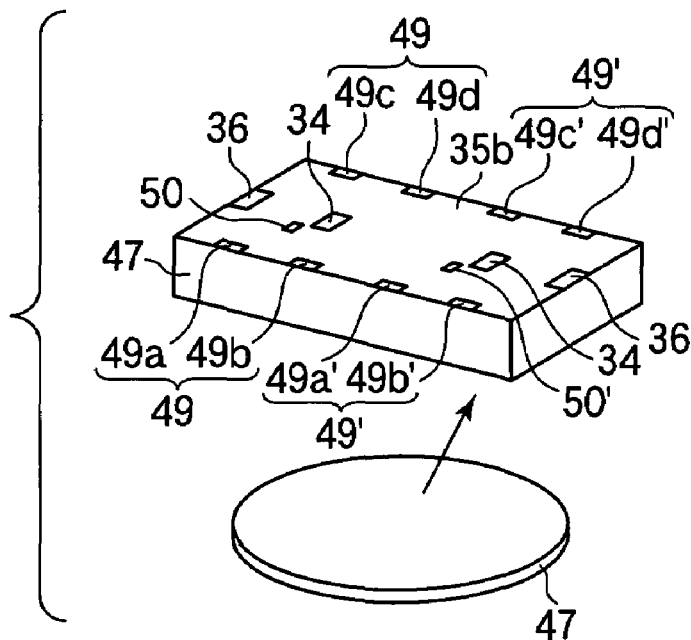

Next, as shown in FIG. 5E, polyimide resin is applied to the insulation film 35a and patterned to form the insulation film 35b having openings in which the lead wires 49 and 49', the terminals opposite to the lead terminals 49 and 49' of the lead wires 50 and 50', and the open regions 34 and 36 are exposed.

Figure 6:
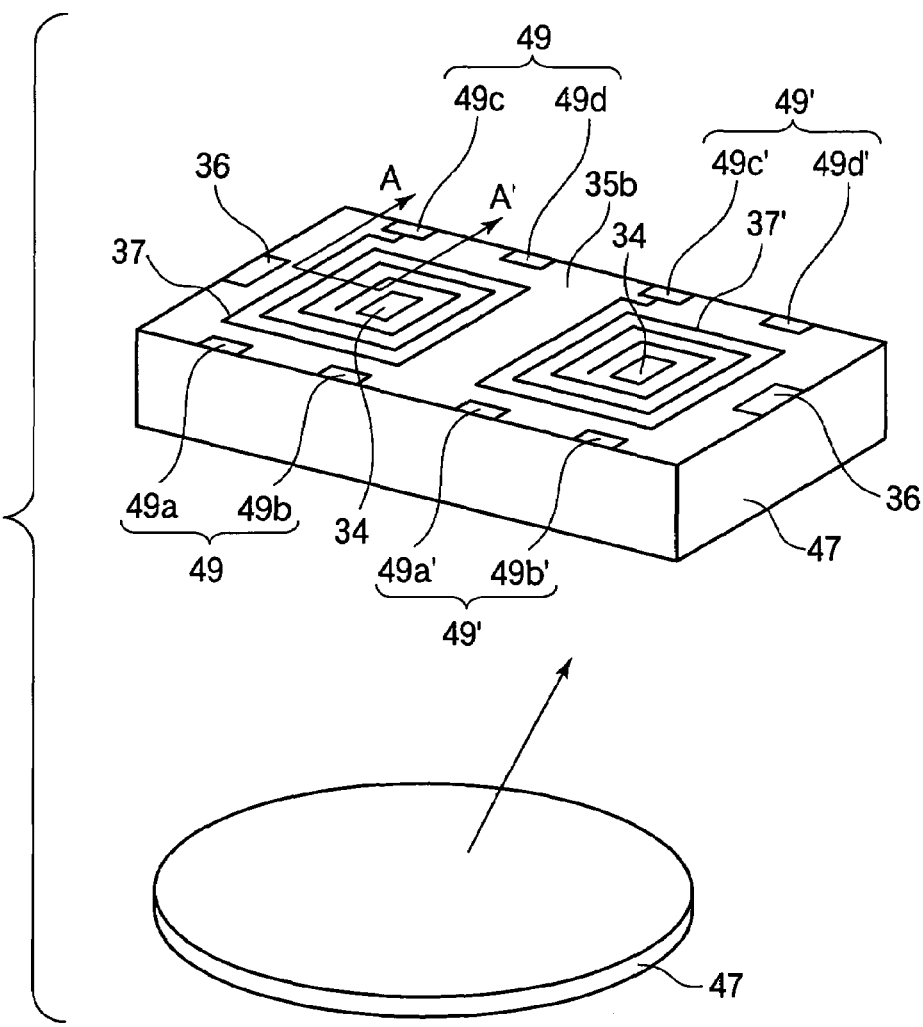
FIG. 6 shows one of the steps for manufacturing the common mode choke coil array 63 according to the third embodiment of the invention and shows coil conductors 37 and 37' formed on an insulation film 35b.

Next, as shown in FIG. 6, the coil conductors 37 and 37' are formed on the insulation film 35b by forming a copper layer (not shown) and patterning it into a spiral configuration. One terminal of the coil conductor 37 is formed on the lead terminal 49c which is exposed at an opening of the insulation film 35b, and another terminal of the conductor is formed on the terminal opposite to the lead terminal 49a of the lead wire 50. Similarly, one terminal of the coil conductor 37' is formed on the lead terminal 49c' which is exposed at an opening of the insulation film 35b, and another terminal of the conductor is formed on the terminal opposite to the lead terminal 49a' of the lead wire 50'. As a result, the lead terminal 49a and the lead terminal 49c are electrically connected through the coil conductor 37 and the lead wire 50. Similarly, the lead terminal 49a' and the lead terminal 49c' are electrically connected through the coil conductor 37' and the lead wire 50'. Terminal patterns made of copper are also formed on the remaining lead terminals 49b, 49b', 49d and 49d'.

Figure 7A:
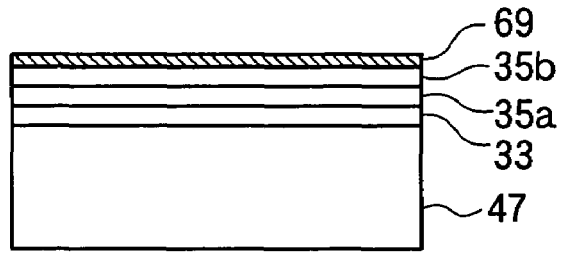
FIGS. 7A to 7C show steps for manufacturing the coil conductor 37 of the common mode choke coil array 63 according to the third embodiment of the invention and show a section taken orthogonally to a film forming surface of a wafer 47 along the imaginary straight line A–A' shown in FIG. 6.

The coil conductors 37 and 37' are formed using a frame plating process. The frame plating process will now be described with reference to FIGS. 7A to 8C. The frame plating process is a method in which a plating film is patterned using a mold formed by patterning a resist (hereinafter referred to as "resist frame"). FIGS. 7A to 8C show a section taken orthogonally to the surface of the wafer 47 along the imaginary straight line A–A' shown in FIG. 6 and show steps for manufacturing the coil conductor 37. The first insulation layer 33, the insulation film 35a and the insulation film 35b have been formed in the order listed on the wafer 47 through the manufacturing steps shown in FIGS. 5A to 5E. As shown in FIG. 7A, an electrode layer 69 is formed on the insulation film 35b using a sputtering process or evaporation process. A bonding layer in the form of, for example, a Cr (chromium) film or Ti (titanium) film may be formed under the electrode layer 69 to improve adhesion to the insulation film 35*b*. The electrode layer 69 is desirably the same material as the metal material used for plating if possible, although there will be no problem as long as it is a conductive material.

Figure 7B:
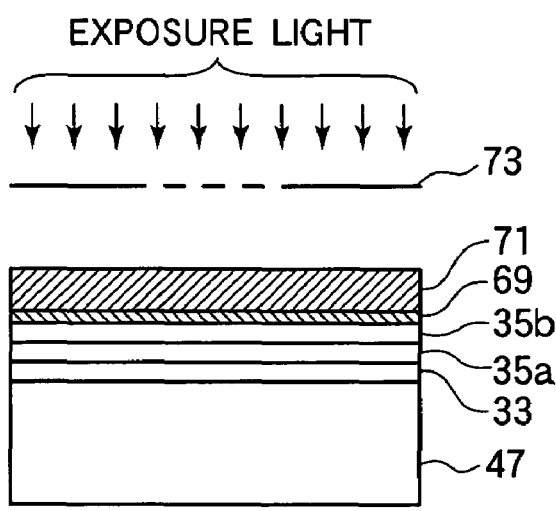

Next, as shown in FIG. 7B, a resist layer 71 is formed by applying a resist on the entire surface, and a pre-baking process is performed on the resist layer 71 as occasion demands. The resist layer 71 is then exposed by irradiating it with exposure light through a mask 73 on which the pattern of the coil conductor 37 is drawn.

Figure 7C:
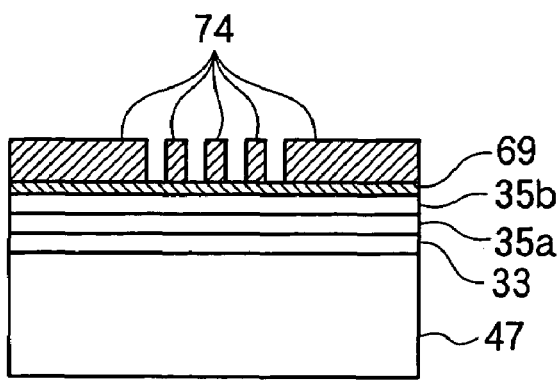
Figure 8A:
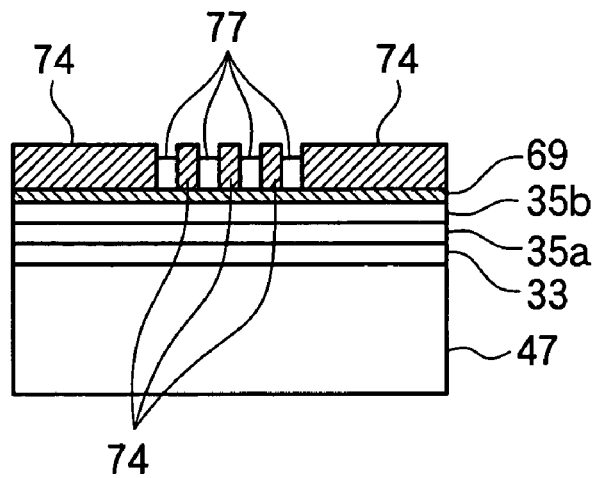
FIGS. 8A to 8C show steps for manufacturing the coil conductor 37 of the common mode choke coil array 63 according to the third embodiment of the invention and show the section taken orthogonally to the film forming surface of the wafer 47 along the imaginary straight line A–A' shown in FIG. 6.
Figure 8B:
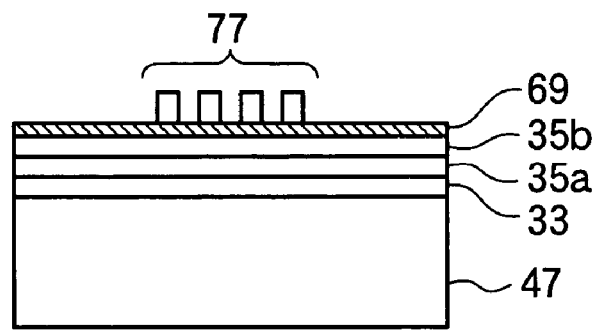
Figure 8C:
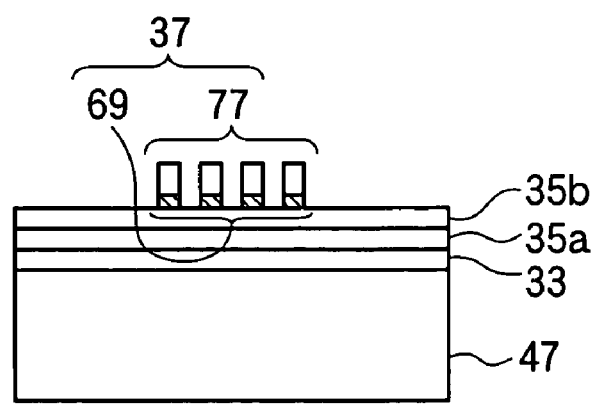

Then development is performed using an alkali developing solution after performing a thermal process as occasion demands. For example, a tetramethyl ammonium hydroxide (TMAH) in a predetermined density is used as the alkali developing solution. The developing step is then followed by a cleaning step. The developing solution in the resist layer 71 is cleaned away using a cleaning fluid to stop the developing and dissolving reaction of the resist layer 71, thereby forming a resist frame 74 patterned in a predetermined configuration as shown in FIG. 7C. For example, pure water is used as the cleaning solution.

When the cleaning is completed, the cleaning fluid is scattered away to dry the wafer. The wafer 47 may be heated to dry up the cleaning fluid if necessary. Next, a plating process is carried out by immersing the wafer 47 in a plating solution in a plating bath and using the resist frame 74 as a mold to form plating films 77 in gaps in the resist frame 74 (see FIG. 8A). Next, the resist frame 74 is peeled off from the insulation film 35*b* using an organic solvent (see FIG. 8B) after washing and drying it as occasion demands. The electrode layer 69 is then removed through dry etching (ion milling or reactive ion etching (RIE)) or wet etching using the plating film 77 as a mask. The coil conductor 37 is thus formed (see FIG. 8C).

Figure 9A:
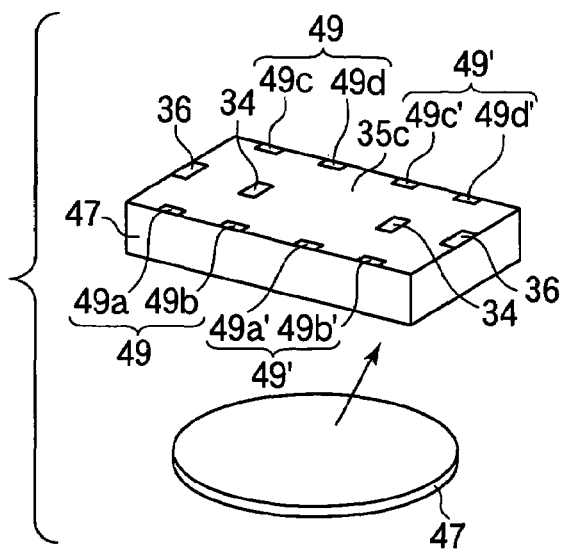
FIGS. 9A to 9E show steps for manufacturing the common mode choke coil array 63 according to the third embodiment of the invention.
Figure 9B:
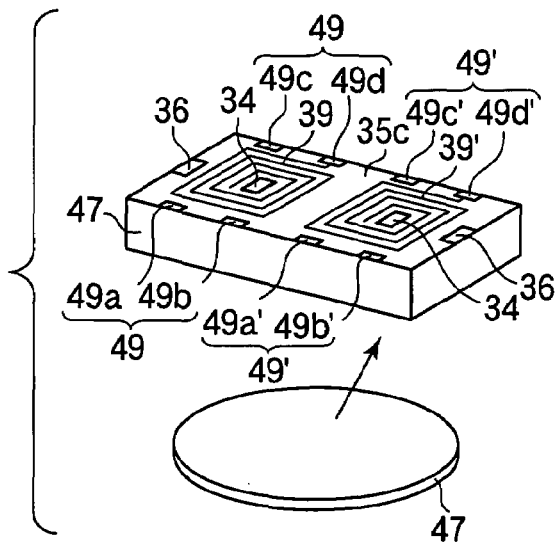

When the coil conductor 37 is formed using a frame plating process, as shown in FIG. 9A, polyimide resin is applied on the insulation film 35*b* so as to cover the coil conductors 37 and 37' and patterned to form the insulation film 35*c* which has openings in which the lead terminals 49 and 49' and the open regions 34 and 36 are exposed. Next, as shown in FIG. 9B, a copper layer is formed, and a frame plating process is used to form the coil conductors 39 and 39' patterned in the form of spirals on the insulation film 35*c*. One terminal of the coil conductor 39 is formed on the lead terminal 49*d* exposed at an opening of the insulation film 35*c*. Similarly, one terminal of the coil conductor 39' is formed on the lead terminal 49' exposed at an opening of the insulation film 35*c*. The coil conductors 39 and 39' will not be described because they are formed using a frame plating process similar to that in the method of manufacturing the coil conductors 37 and 37' described with reference to FIGS. 7A to 8C.

Figure 9C:
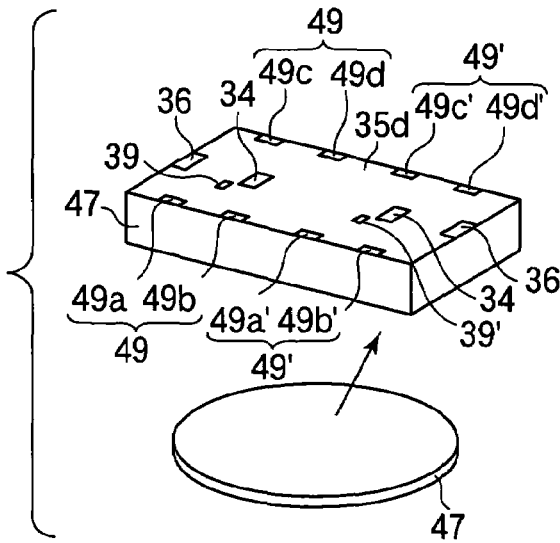

Next, as shown in FIG. 9C, polyimide resin is applied on the insulation film 35*c* so as to cover the coil conductors 39 and 39' and patterned to form the insulation film 35*d* having openings at which the lead terminals 49 and 49', other terminals of the coil conductors 39 and 39', and the open regions 34 and 36 are exposed.

Figure 9D:
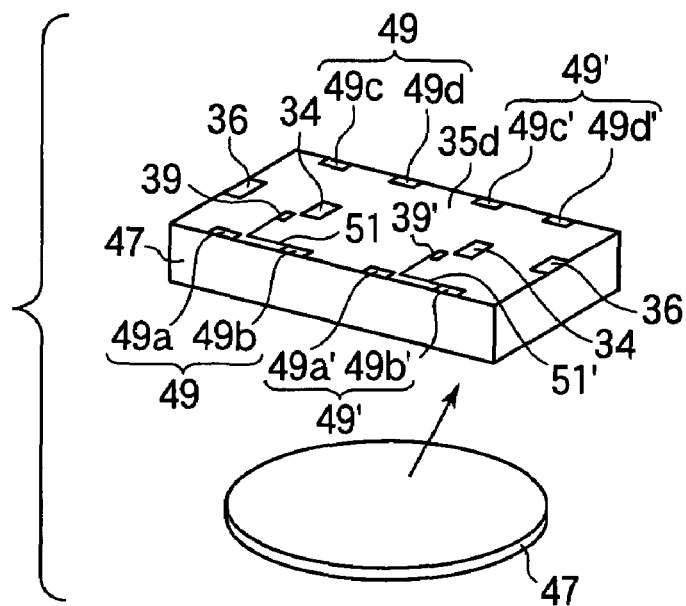

Next, as shown in FIG. 9D, a copper layer (not shown) is formed on the insulation layer 35*d* to form the lead wire 51 connecting the lead terminal 49*b* and the coil conductor 39 and the lead wire 51' connecting the lead terminal 49*b*' and the coil conductor 39'. Thus, the lead terminal 49*b* and the lead terminal 49*d* are electrically connected through the coil conductor 39 and the lead wire 51. Similarly, the lead terminal 49*b*' and the lead terminal 49*d*' are electrically connected through the coil conductor 39' and the lead wire 51'. Terminal patterns made of copper are also formed on the remaining lead terminals 49*a*, 49*a*', 49*c* and 49*c*'.

Figure 9E:
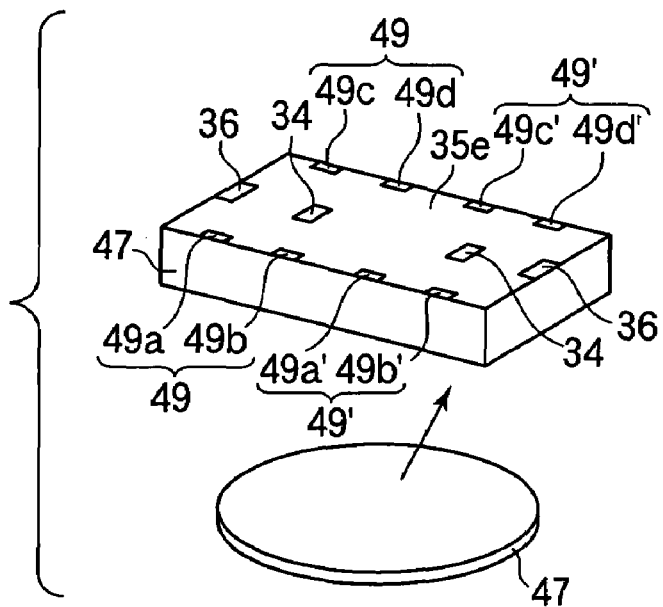

Next, as shown in FIG. 9E, polyimide resin is applied on the insulation film 35*d* so as to cover the lead wires 51 and 51' and patterned to form the insulation film 35*e* having openings at which the lead terminals 49 and 49' and the open regions 34 and 36 are exposed.

Figure 10A:
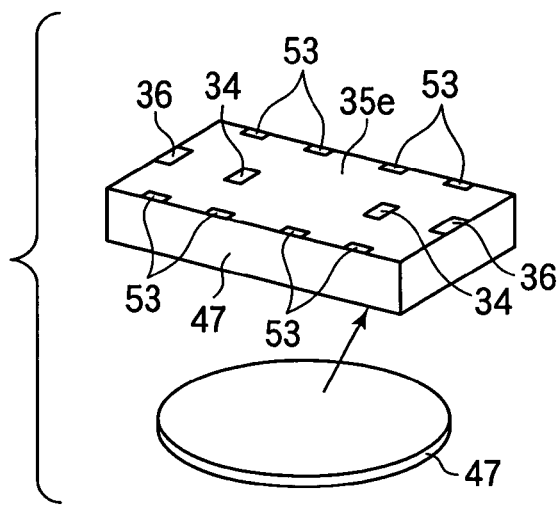
FIGS. 10A to 10E show steps for manufacturing the common mode choke coil array 63 according to the third embodiment of the invention.
Figure 10B:
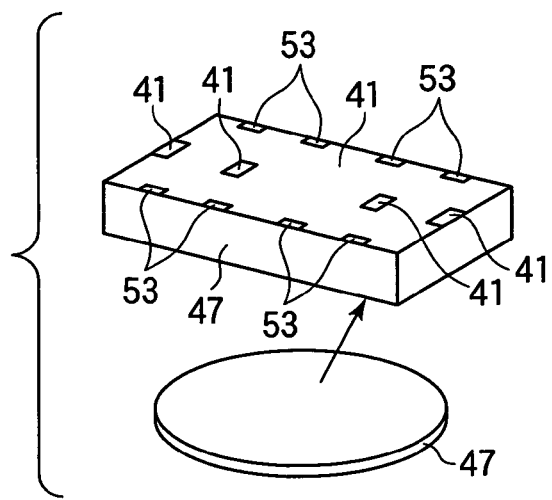

Next, silver paste 53 is printed on the lead terminals 49 and 49' using the screen printing method as shown in FIG. 10A. Next, the magnetic layer 41 of composite ferrite obtained by mixing magnetic powder of ferrite in polyimide resin is formed on the insulation film 35*e* as shown in FIG. 10B. Thus, the magnetic layer 41 fills the open regions 34 and 36 and reaches the surface of the first insulation layer 33.

Figure 10C:
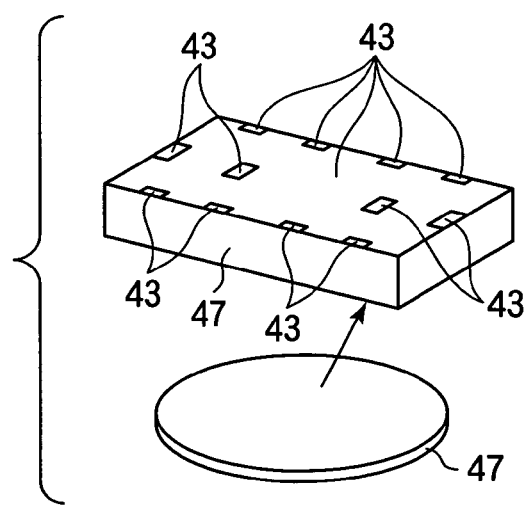
Figure 10D:
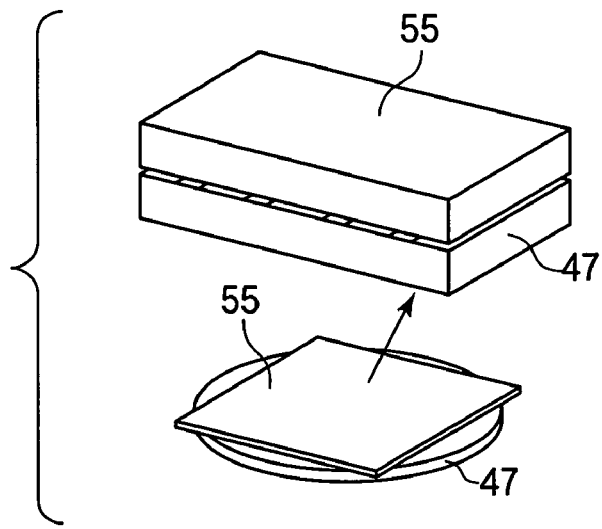
Figure 10E:
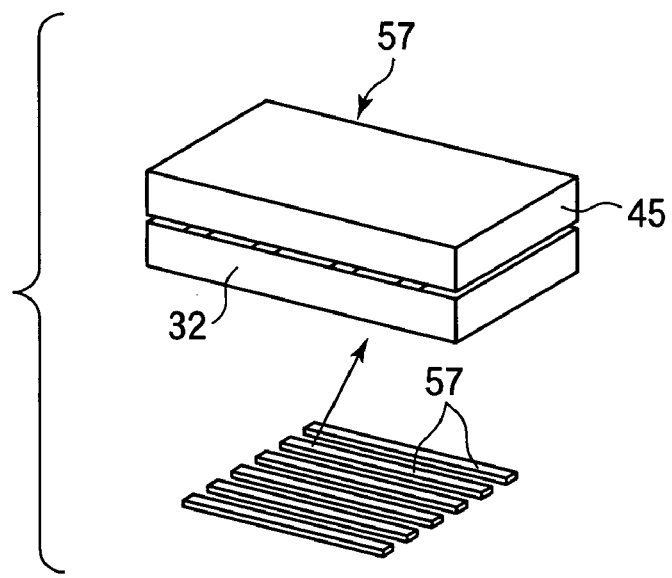

Next, as shown in FIG. 10C, a bonding agent is applied on the magnetic layer 41 to form the bonding layer 43. Next, as shown in FIG. 10D, a top cover magnetic plate 55 which will eventually serve as the second magnetic substrate 45 is secured on the bonding layer 43. The wafer 47 is then cut to form bar members 57 on which a plurality of common mode choke coil arrays 63 are arranged in a row, as shown in FIG. 10E.

Figure 11A:
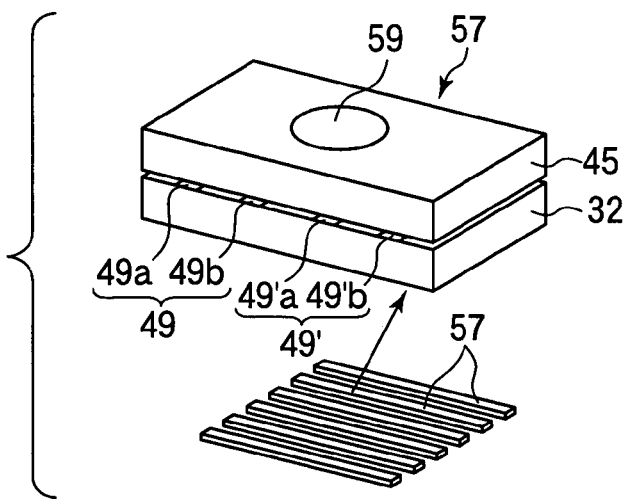
FIGS. 11A to 11E show steps for manufacturing the common mode choke coil array 63 according to the third embodiment of the invention.
Figure 11B:
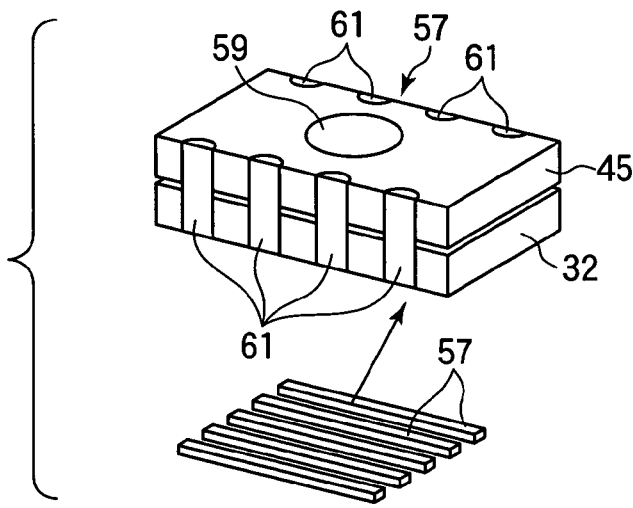

Next, as shown in FIG. 11A, a mark 59 for identifying the first and second substrates 32 and 45 of each common mode choke coil array 63 on the bar member 57 is printed on a top surface of the array. Next, as shown in FIG. 11B, Ni electrode films 61 are formed using the sputtering method, the films being formed substantially perpendicularly to the surface of the first magnetic substrate 32 and across the first magnetic substrate 32 and the second magnetic substrate 45 in the positions of the lead terminals 49 and 49' provided on sides of the bar member 57.

Figure 11C:
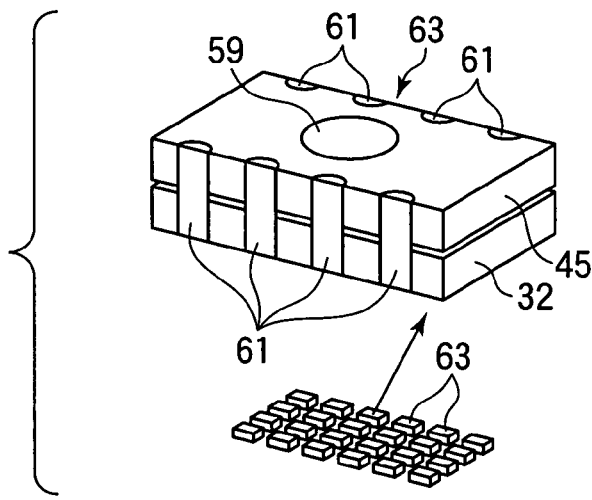
Figure 11D:
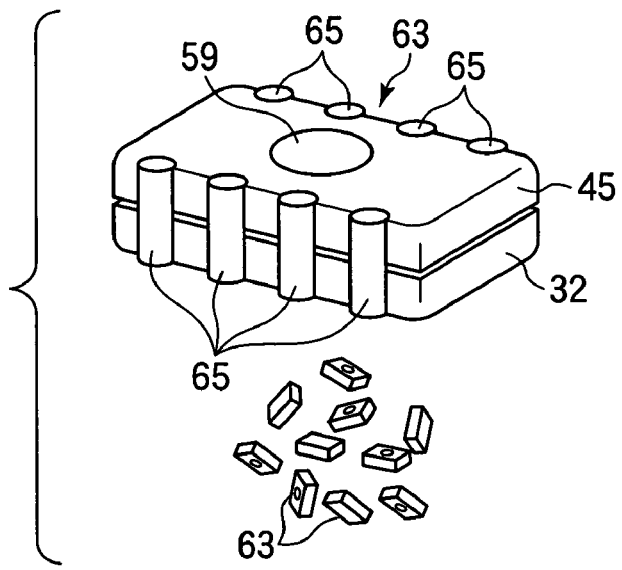

Next, as shown in FIG. 11C, the bar member 57 is cut and separated into individual common mode choke coil arrays 63. Next as shown in FIG. 11D, barrel plating is performed to form a film of a conductive material which is an alloy of Sn (tin), Ni and Cu on the surface of the electrode films 61, thereby forming electrode terminals 65 having a two-layer structure made of Ni and the conductive alloy material.

Figure 11E:
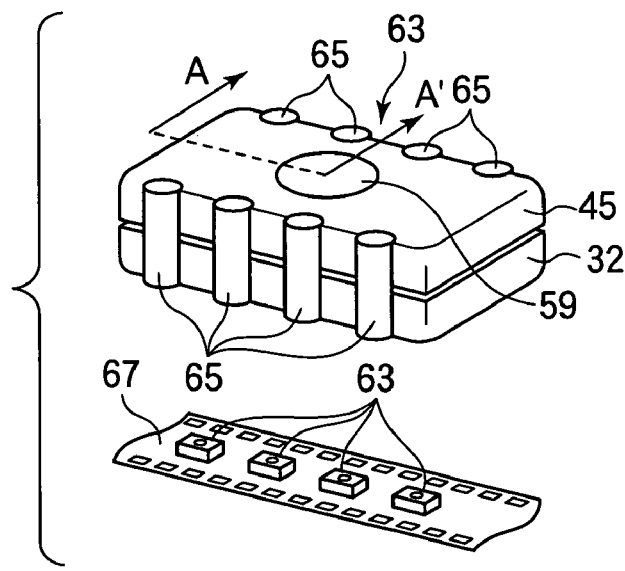

Thereafter, as shown in FIG. 11E, a common mode choke coil array 63 thus manufactured is temporarily held on a reel 67, and the reel 67 and the common mode choke coil array 63 are then covered with a tape which is not shown to complete the manufacture of the same.

In the common mode choke coil array 63 of the present embodiment, insulation resistance on the surface of the first magnetic substrate 32 can be increased because the first insulation layer 33 having a high insulation resistance is formed on the first magnetic substrate 32. It is therefore possible to prevent a plating film from being formed between the first insulation layer 33 and the magnetic layer 41 when the electrode terminals 65 are formed. Insulation resistance between the electrode terminals 65 can therefore be maintained equal to or higher than a guaranteed value of 100 MΩ, and the common mode choke coil array 63 can be provided with improved reliability.

While the second magnetic substrate 45 has substantially the same thickness as that of the first magnetic substrate 32 in the present embodiment, the thickness of the second magnetic substrate 45 may be relatively small. This makes it possible to reduce the height of the common mode choke coil array 63. Although the height of the common mode choke coil array 63 can be also reduced by reducing the thickness of the first magnetic substrate 32, the wafer 47 may be broken during manufacture in this case because of a resultant reduction in the mechanical strength of the wafer 47. It is therefore desirable to form the first insulation layer 33 on the first magnetic substrate 32 having a small thickness also from the viewpoint of improvement in the yield of manufacture. Since the $Al_2O_3$ film (first insulation layer 33) formed on the first magnetic substrate 32 using the sputtering method is much higher in mechanical strength than the ferrite substrate serving as the first magnetic substrate 32, it can increase the mechanical strength of the wafer 47 to prevent breakage of the substrate at the time of manufacture. The diameter of the wafer 47 can therefore be increased to manufacture a large number of common mode choke coil arrays 63 having a high strength as a component even though the thickness of the first magnetic substrate 32 is small. The same advantages can be achieved even when $SiO_2$ or AlN is used for the first insulation layer 33 instead of $Al_2O_3$ because $SiO_2$ or AlN is much higher in mechanical strength than the first magnetic substrate 32.

Further, since the thickness of the first insulation layer 33 can be small according to the present embodiment, the first insulation layer 33 will not hinder the magnetic coupling between the magnetic layer 41 and the first magnetic substrate 32 even if it is provided in the open regions 34 and 36. Therefore, no degradation of impedance characteristics occurs even if the first insulation layer 33 is formed on the entire surface of the first magnetic substrate 32. Since the first insulation layer 33 may be formed on the entire surface of the first magnetic substrate 32 as thus described, a step for patterning the first insulation layer 33 can be omitted.

The first insulation layer 33 is formed to fill voids on the surface of the first magnetic substrate 32, and the surface of the first insulation layer 33 thus formed is in a very even condition. Since the first insulation layer 33 can be thus provided with sufficient evenness and surface insulation properties without forming the insulation film 35a, the coil conductors 37 and 37' may be directly provided on the first insulation layer 33 through fine processing. The distance between the first magnetic substrate 32 and the coil conductors 37 and 37' can be smaller than that in a common mode choke coil array according to the related art, and the common mode choke coil array 63 can therefore be provided with a smaller size and a smaller height.

Further, since the first insulation layer 33 is in a very even surface condition, adhesion between the first insulation layer 33 and the magnetic layer 41 made of composite ferrite can be improved, which makes it possible to prevent the plating solution from entering when the electrode terminals are barrel-plated and to thereby prevent shorting failures between the electrode terminals.

While the lead terminals 49 and 49' and the lead wire 50 are formed on the insulation film 35a in the present embodiment, the lead terminals 49 and so on may be formed directly on the first insulation layer 33 to manufacture a reliable and compact common mode choke coil array 63 having a small height without making any addition to manufacturing steps according to the related art.

The invention is not limited to the third embodiment described above and may be modified in various ways.

Although the first insulation layer 33 is formed only on the first magnetic substrate 32 in the third embodiment, the invention is not limited to the same arrangement. For example, it is obviously possible to use a second magnetic substrate 45 having a third insulation layer similar to that of the first magnetic substrate 32, the insulation layer being formed on a surface facing the first magnetic substrate 32. In this case, since the adhesion of the second magnetic substrate 45 is improved, the substrate maybe directly bonded to the magnetic layer 41 using composite ferrite without the bonding layer 43.

While the first insulation layer 33 is formed on the entire surface of the first magnetic substrate 32 in the third embodiment described above, the invention is not limited to the same arrangement. For example, the first insulation layer 33 may obviously provided only in the vicinity of the electrode films 61 and the electrode terminals 65. In this case again, the occurrence of shorting failures between the electrode terminals can be prevented when the electrode films 61 and the electrode terminals 65 are formed. Therefore, insulation resistance between the electrode terminals 65 can be maintained equal to or higher than a guaranteed value of 100 MΩ, and the reliability of the common mode choke coil array 63 can be improved.

While the third embodiment of the invention has been described with reference to a common mode choke coil array 63 by way of example, this is not limiting the invention. For example, a coil component according to the third embodiment may be used as a major component of a transformer.

What is claimed is:

1. A coil component comprising:
   an insulation layer for impedance value adjustment formed on an entire principal surface of a first magnetic substrate;
   a coil pattern and insulation layers which are alternately formed on the insulation layer for impedance value adjustment;
   an insulation-layer-removed region formed by removing either or both of parts of the insulation layers located in a central region surrounded by the coil pattern and a region around the coil pattern and in which the insulation layer for impedance value adjustment is exposed;
   a resin including magnetic powder provided on the uppermost insulation layer and the insulation-layer-removed regions; and
   a second magnetic substrate bonded through a bonding layer formed on the resin including magnetic powder.

2. A coil component according to claim 1, wherein the thickness of the insulation layer for impedance value adjustment is in the range from 1 micron to 20 microns.

3. A coil component according to claim 1, wherein the insulation layer for impedance value adjustment is made of polyimide.

4. A coil component according to claim 1, wherein a plurality of the coil patterns are formed.

5. A coil component comprising:
   a first magnetic substrate formed of a magnetic material;
   a second magnetic substrate formed of a magnetic material and provided opposite to the first magnetic substrate;
   a plurality of electrode terminals provided across sides of the first and the second magnetic substrates;
   a first insulation layer formed on the first magnetic substrate and preventing a shorting failure between the plurality of electrode terminals;
   a second insulation layer formed on the first insulation layer;
   a coil conductor embedded in the second insulation layer and formed in a spiral configuration and connected to at least one of the plurality of electrode terminals;
   an open region which is formed on the inner circumference side and on the outer circumference side of the coil conductor and in which the first insulation layer is expose; and
   a magnetic layer embedded in the open region and securing the second magnetic substrate.

6. A coil component according to claim 5, wherein a third insulation layer is further formed between the magnetic layer and the second magnetic substrate.

7. A coil component according to claim 5, wherein the first insulation layer is formed in the vicinity of the electrode terminal.

8. A coil component according to claim 5, wherein the first insulation layer is formed of $Al_2O_3$.

9. A coil component according to claim 5, wherein a plurality of the coil conductors is formed so as to sandwich the insulation films.

10. A coil component according to claim 5, wherein an insulation resistance between the adjacent electrode terminals is maintained equal to or greater than 100 MΩ.

* * * * *